United States Patent
Matsui et al.

(10) Patent No.: US 8,465,990 B2
(45) Date of Patent: Jun. 18, 2013

(54) MANUFACTURING METHOD OF MAGNETO-RESISTANCE EFFECT ELEMENT

(75) Inventors: Naoko Matsui, Machida (JP); Eiji Ozaki, Higashiyamato (JP); Hiroshi Akasaka, Saitama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 209 days.

(21) Appl. No.: 13/087,054

(22) Filed: Apr. 14, 2011

(65) Prior Publication Data

US 2011/0256642 A1   Oct. 20, 2011

(30) Foreign Application Priority Data

Apr. 16, 2010   (JP) .................................. 2010-095253
Mar. 1, 2011    (JP) .................................. 2011-043861

(51) Int. Cl.
*H01L 21/00*   (2006.01)

(52) U.S. Cl.
USPC .......................... 438/3; 438/771; 257/E21.09

(58) Field of Classification Search
USPC ........... 438/3, 771; 257/421, E21.09, E21.24, 257/E29.323
See application file for complete search history.

(56) References Cited

U.S. PATENT DOCUMENTS

| | | | |
|---|---|---|---|
| 2002/0196591 A1 | 12/2002 | Hujanen et al. | 360/326 |
| 2003/0030948 A1* | 2/2003 | Umetsu | 360/324.12 |
| 2004/0161636 A1 | 8/2004 | Hujanen et al. | |

FOREIGN PATENT DOCUMENTS

JP     2003-059016 A    2/2003

* cited by examiner

*Primary Examiner* — Charles Garber
*Assistant Examiner* — Abdulfattah Mustapha
(74) *Attorney, Agent, or Firm* — Fitzpatrick, Cella, Harper & Scinto

(57) ABSTRACT

The present invention provides a manufacturing method of a magneto-resistance effect element, in which the step coverage of a formed film can be enlarged and also the film can be deposited in a low temperature range. In an embodiment of the present invention, an insulating protective layer is formed on a multilayered structure by a plasma CVD apparatus in which a plasma source and a film deposition chamber are separated from each other by a partition wall plate. According to the present method, it is possible to deposit the protective layer without inviting the degradation of a magnetic characteristic and also to perform low temperature film deposition even at a temperature lower than 150° C. Hence, it is possible to deposit the protective layer while leaving resist and also to reduce the number of steps in the manufacturing of the magneto-resistance effect element having a multilayered structure.

6 Claims, 13 Drawing Sheets

FIG. 2A
- S901 ETCHING
- S902 PROTECTION LAYER DEPOSITION (CVD)
- S903 HARD BIAS LAYER DEPOSITION
- S904 LIFT-OFF
- S905 UPPER SHIELD LAYER DEPOSITION
FIG. 2B
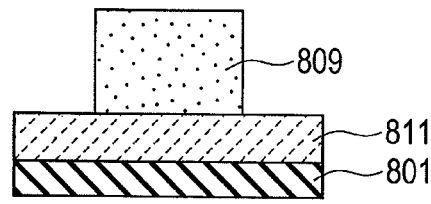
FIG. 2C
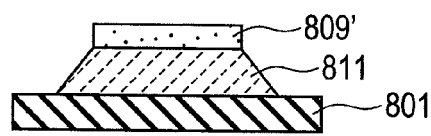
FIG. 2D
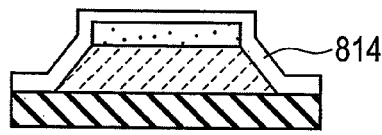
FIG. 2E
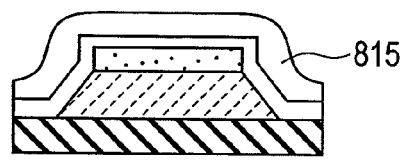
FIG. 2F
FIG. 2G
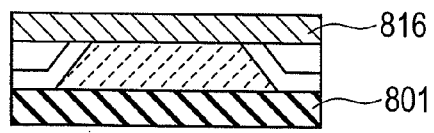

MANUFACTURING METHOD OF MAGNETO-RESISTANCE EFFECT ELEMENT

BACKGROUND OF THE INVENTION

1. Field of the Invention

The present invention relates to a manufacturing method of a magneto-resistance effect element preferably utilized for an MRAM (Magnetic Random Access Memory) which is an integrated magnetic memory, a thin film magnetic head, and the like.

2. Description of the Related Art

The MRAM is an integrated magnetic memory which has an integration density as high as a DRAM and a speed as high as an SRAM and also is a rewritable memory which can be rewritten without limitation, and thereby the MRAM is gathering attention. Further, the developments of a thin film magnetic head, a magnetic sensor, and the like are making respective rapid progresses using a magneto-resistance effect element such as a GMR (Giant Magneto-Resistance) element and a TMR (Tunneling Magneto-Resistance) element.

An example of the magneto-resistance effect element includes the one in which a lower electrode is formed on a substrate such as a silicon substrate, a glass substrate, or the like, and a multilayered film having eight layers constituting a magneto-resistance effect element (TMR) is formed thereon. An example of this multilayered film having eight layers includes the one in which a Ta layer serving as an underlayer formed in the undermost layer, a PtMn layer serving as an anti-ferromagnetic layer formed thereon, a magnetization pinned layer (pinned layer, Ru, and pinned layer), an insulating layer (barrier layer), a free layer, and a cap layer are stacked sequentially.

There has been a proposal in which a substrate having the multilayered magnetic film constituting the magneto-resistance effect element is processed by a thin film processing technique such as reactive ion etching (RIE) and ion beam etching (IBE) which have been developed in the semiconductor industry, to obtain a desired performance.

After the processing of the multilayered magnetic film has been completed, an insulating protective layer is formed thereon. Features required for this protective layer include a high break down voltage, a high step coverage, a small surface roughness Ra, and a uniform film thickness distribution even in a thin film (5 to 10 nm).

Conventionally, a method of using a sputter method or a method of using atomic layer deposition has been specified as a method of forming this protective layer (refer to Japanese Patent Application Laid-Open Publication No. 2003-59016 and Torii et al., TAIYO NISSAN Technical Report, No. 24 (2005) 2-7).

However, the conventional deposition method has the following problems.

(1) A high step coverage cannot be obtained in an $Al_2O_3$ protective film made by the sputter method.

(2) The $Al_2O_3$ film made by the sputter method is directly irradiated with plasma, and thereby a pinhole is formed in the insulating layer, which easily causes insulation breakdown.

(3) An $Al_2O_3$ film formed by using the atomic layer deposition (ALD) requires a long deposition time for forming an atomic layer.

(4) For the $Al_2O_3$ formed by using the atomic layer deposition (ALD), a complex chemical compound such as an alkylaluminum compound and aluminum alkoxide needs to be used as a source material (Japanese Patent Application Laid-Open Publication No. 2003-59016).

(5) The atomic layer deposition (ALD) uses a high temperature range of 150 to 350° C. (Torii et al., TAIYO NISSAN Technical Report, No. 24 (2005) 2-7).

(6) The $Al_2O_3$ formed by the atomic layer deposition (ALD) uses $H_2O$ as an oxidation agent and thereby a magnetic layer is damaged by water contained in the layer and a magnetic characteristic is degraded.

SUMMARY OF THE INVENTION

The present invention aims at providing a manufacturing method of a magneto-resistance effect element which can enlarge the step coverage of a formed film and also can deposit a film in a low temperature range.

A first aspect of the present invention is a manufacturing method of a magneto-resistance effect element comprising a multilayered structure including two ferromagnetic layers and an intermediate layer sandwiched between the ferromagnetic layers, wherein a partition wall having at least one through-hole is provided between a plasma generation space capable of generating plasma and a film-deposition processing space which is provided separately from the plasma generation space and in which a substrate holding part capable of mounting a substrate to be processed is disposed, and also the plasma generation space and the film-deposition processing space are connected to each other by the at least one through-hole, and the method comprises: introducing an active species generated from a first source gas in the plasma generation space into the film-deposition processing space through the at least one through-hole; and causing the reactive species to react with a second source gas in the film-deposition processing space to form an insulating protective layer on a multilayered structure formed in the substrate to be processed mounted on the substrate holding part.

A second aspect of the present invention is a manufacturing method of a magneto-resistance effect element, the method comprising the steps of: preparing a multilayered structure which has been processed into a predetermined shape and has a resist layer formed thereon, the resist layer having been used in the processing; forming a protective layer on a surface of the multilayered structure exposed by the processing and on the resist layer formed on the multilayered structure at a temperature at which the resist layer is not deformed by heat; and removing the resist layer and a part of the protective layer so as to remove at least the resist layer.

According to the present invention, it is possible to obtain a sufficiently large step coverage, since a CVD method is applied using an active species.

Further, since film deposition can be carried out in a low temperature range, magnetic characteristic degradation can be suppressed, and also resist deformation caused by temperature rise during the film deposition can be suppressed and thereby the number of steps can be reduced in the manufacturing of a magneto-resistance effect element having a multilayered structure.

BRIEF DESCRIPTION OF THE DRAWINGS

FIGS. 2A to 2G are diagrams showing an example of manufacturing steps of a magneto-resistance effect element for a magnetic head according to an embodiment of the present invention.

Figure 8:
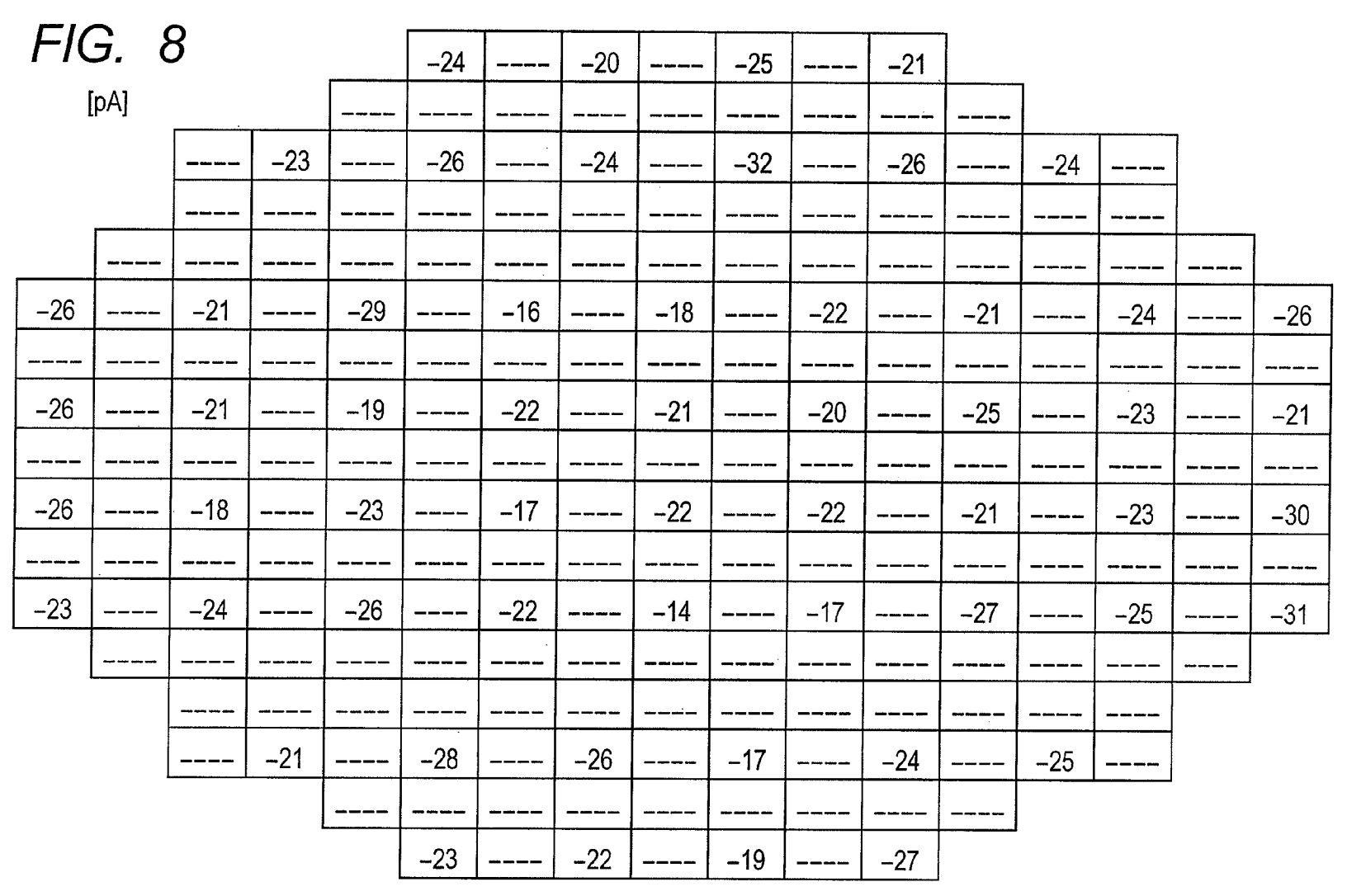

FIG. 8 is a diagram showing a measurement result of a MOS capacitor I V characteristic according to an embodiment of the present invention. (Leak current of Example)

FIG. 11 is a diagram showing a measurement result of a MOS capacitor I V characteristic according to an embodiment of the present invention. (Insulation breakdown voltage of Comparative example)

DETAILED DESCRIPTION OF THE INVENTION

Hereinafter, an embodiment of the present invention will be described.

Figure 1:
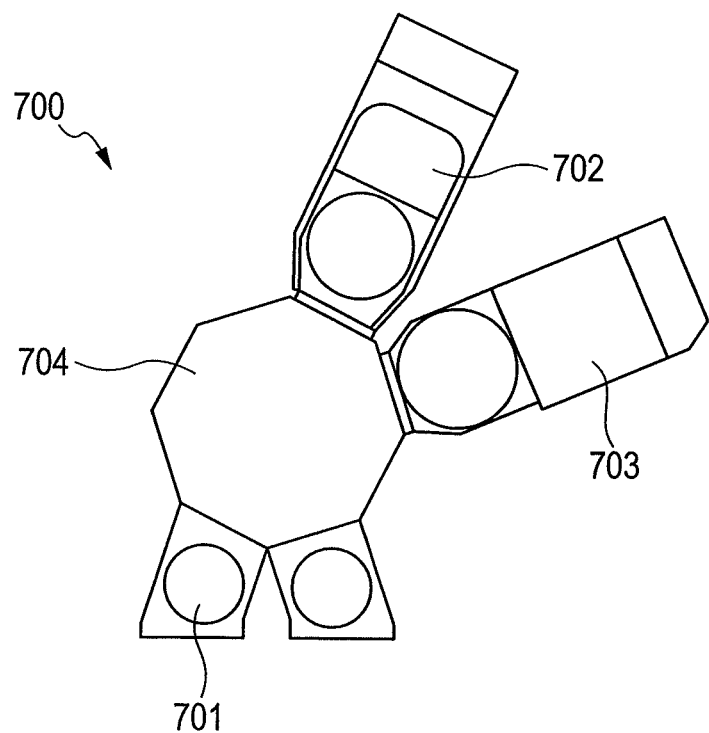
FIG. 1 is an outline view of a manufacturing apparatus according to an embodiment of the present invention.
Figure 3:
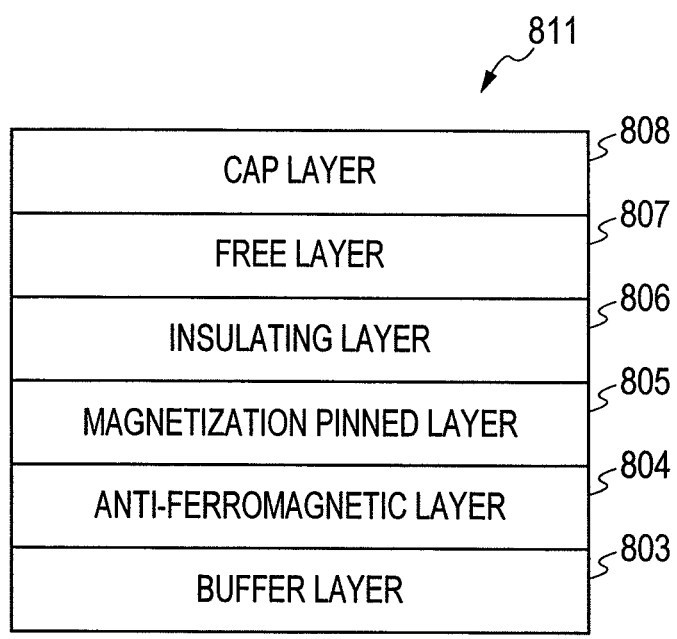
FIG. 3 is a diagram showing a configuration example of a multilayered structure according to an embodiment of the present invention.

FIG. 1 is an outline view of a cluster type manufacturing apparatus 700 according to the present embodiment, FIGS. 2A to 2G are diagrams showing an example of manufacturing steps of a magneto-resistance effect element for a magnetic head according to the present embodiment, and FIG. 3 shows a configuration example of a multilayered structure according to the present embodiment.

The manufacturing apparatus 700 of FIG. 1 includes an etching chamber 702 for performing etching processing, a film deposition chamber 703 for performing CVD deposition, a transfer chamber 704 in which a transfer robot is disposed for transferring a substrate to each of the chambers within the apparatus 700, and a substrate mounting chamber 701 for carrying-in or carrying-out the substrate into or from the apparatus 700. The transfer chamber 704 is connected to each of the chambers (701 and 702) disposed therearound air-tightly via a gate valve. Further, each of the chambers 701 to 704 is provided with exhaust equipment such as a turbo-molecular pump and can perform pressure reduction independently, and thereby the substrate can be transferred between the chambers and subjected to continuous processing under a vacuum condition.

An object to be processed as shown in FIG. 2B is introduced into the apparatus 700 of FIG. 1. This object to be processed is formed by sequentially stacking a multilayered structure 811 and a resist layer 809 on a lower shield layer 801 (e.g., permalloy (NiFe)). The resist layer 809 as an organic mask material is made of an organic compound and formed into a predetermined pattern. The multilayered structure 811 includes two ferromagnetic layers and an intermediate layer sandwiched between the ferromagnetic layers. For example, as shown in FIG. 3, the multilayered structure 811 includes a buffer layer 803 (e.g., laminate of Ta layer and Ru layer), an anti-ferromagnetic layer 804 (e.g., PtMn layer), a magnetization pinned layer 805 (e.g., laminate of CoFe layer, Ru layer and CoFe layer), an insulating layer (barrier layer) 806 (e.g., MgO or $AlO_x$), a free layer 807 as a magnetization free layer (e.g., CoFe layer), and a cap layer 808 (e.g., Ru layer). Further, the cap layer 808 is made of a non-magnetic conductive material and performs a function of protecting the multilayered structure 811 and also preventing or reducing magnetic interaction between an upper shield layer to be described below and the multilayered structure 811. The multilayered structure 811 can be deposited continuously under a vacuum condition (under vacuum) by a sputter method.

That is, before a protective layer deposition step (Step S902 of FIG. 2A) by CVD to be described below, the object to be processed having the multilayered structure 811 in which the plural magnetic layers are stacked, and the resist layer 809 formed on the multilayered structure and having a predetermined pattern is prepared.

First, the above object to be processed is introduced into the etching chamber 702 and the multilayered structure 811 is processed into a pattern shape based on the resist layer 809 (Step S901 of FIG. 2A).

After the multilayered structure 811 has been processed into the predetermined pattern in Step S901 (state of FIG. 2C), the object to be processed is transferred to the film deposition chamber 703 and an insulating protective layer 814 is deposited on the multilayered structure 811 which has been processed into the pattern (Step S902). The protective layer 814 performs a function of electrically insulating the side face of the multilayered structure 811. At this time, while the resist layer 809' remaining over the surface after the etching processing is also left, the protective layer 814 is also formed on the resist layer 809' (state of FIG. 2D). That is, the protective layer 814 is formed on the surface of the multilayered structure 811 exposed by the processing in Step S901 and on the remaining resist layer. Here, in Step S902, it is preferable to deposit the protective layer 814 at a temperature at which the resist layer 809 is not deformed by heat (e.g., temperature lower than 150° C.). Obviously, this temperature without causing the deformation by heat changes depending on a resist layer to be used.

After that, a hard bias layer 815 (e.g., CoPt layer) is deposited on the protective layer 814 (Step S903 of FIG. 2A and FIG. 2E). And the remaining resist layer 809', a part of the protective layer 814, and a part of the hard bias layer 815 are removed so as to remove the resist layer 809 by lift-off (Step S904 of FIG. 2A and FIG. 2F). Subsequently, the upper shield layer (e.g., permalloy (NiFe)) 816 is deposited on a region where the resist layer 809 has been removed (Step S905 of FIG. 2A and FIG. 2G). That is, in the present embodiment, a part of the multilayer 811 is exposed by removing the resist layer 809'.

Next, each processing will be explained in detail.

Figure 4:
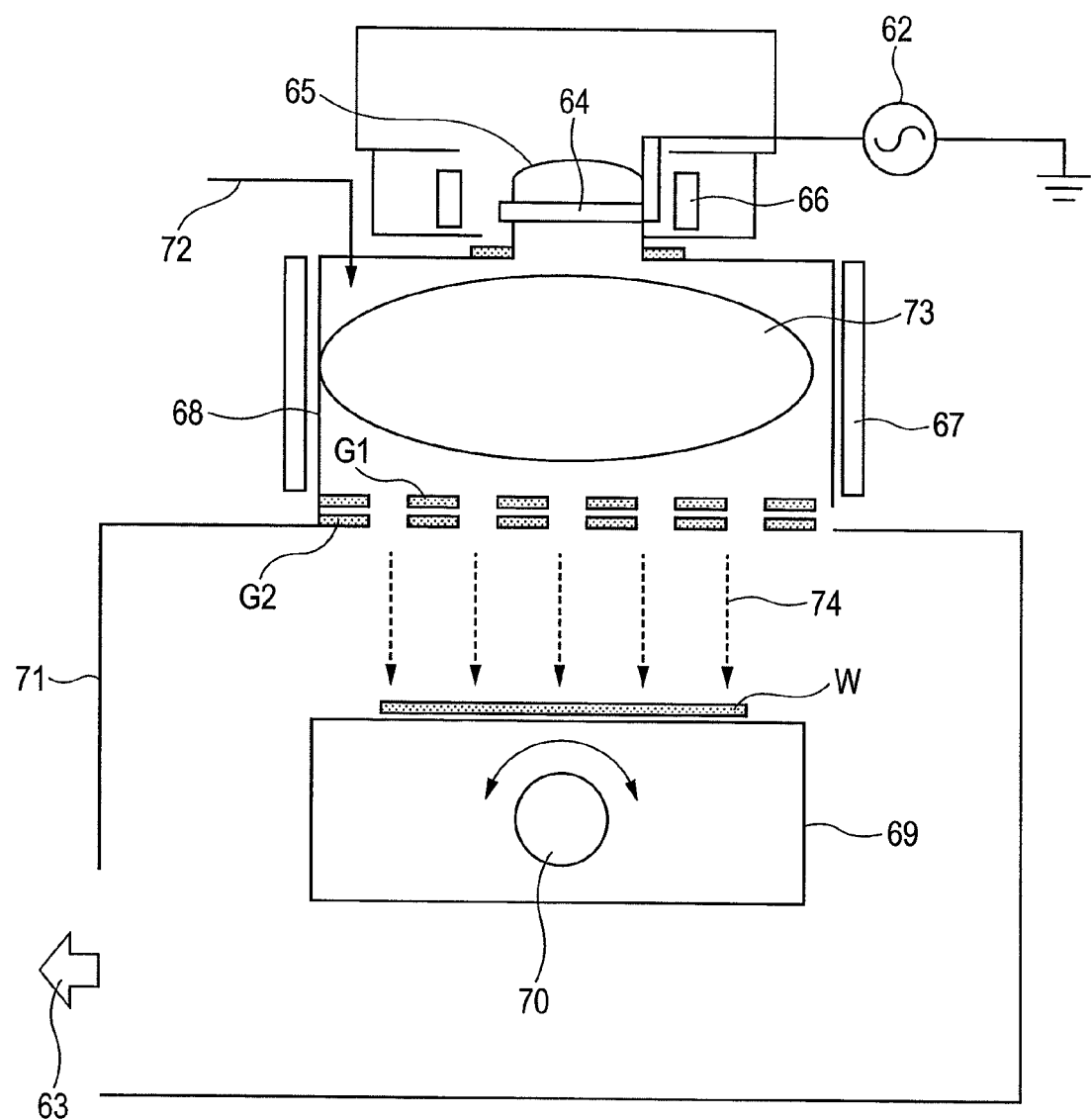
FIG. 4 is a diagram showing an example of an etching chamber according to an embodiment of the present invention.

FIG. 4 is a diagram showing an example of the etching chamber 702 for performing the etching processing in the present embodiment. As an example of the etching, the present embodiment performs ion beam etching (hereinafter, IBE) using plasma of inert gas such as Ar.

In the IBE apparatus of FIG. 4, a dielectric container 65, a plasma generation chamber 68, and a substrate processing chamber 71 are connected to one another so as to be capable of vacuum exhaustion by an exhaustion system 63. Around the dielectric container 65, there are disposed a one-turn antenna 64 and a plasma control magnet 66. The one-turn antenna 64 generates an induced magnetic field by current supply from a high frequency (e.g., 13.56 MHz) plasma power source 62. Such this configuration can generate plasma by introducing Ar gas or the like into the dielectric container 65 by a gas introduction system 72 via the plasma generation chamber 68. Further, a side wall magnet 67 is disposed around the plasma generation chamber 68 and the plasma is prevented from being diffused. Grids G1 and G2 are provided between the plasma generation chamber 68 and the substrate processing chamber 71. These grids G1 and G2 accelerate an ion (Ar+ ion or the like) by forming an electric field. When electric potentials of different magnitude are provided for the grids G1 and G2, respectively, the potential difference accelerates the ion from the plasma generation chamber 68 toward the substrate processing chamber 71. A substrate holder 69 holding a substrate W is disposed in the substrate processing chamber 71. This substrate holder 69 can tilt a substrate mounting plane so as to have a predetermined angle against an ion beam 74 by a rotation mechanism (rotation axis is indicated by reference numerical 70).

Figure 5:
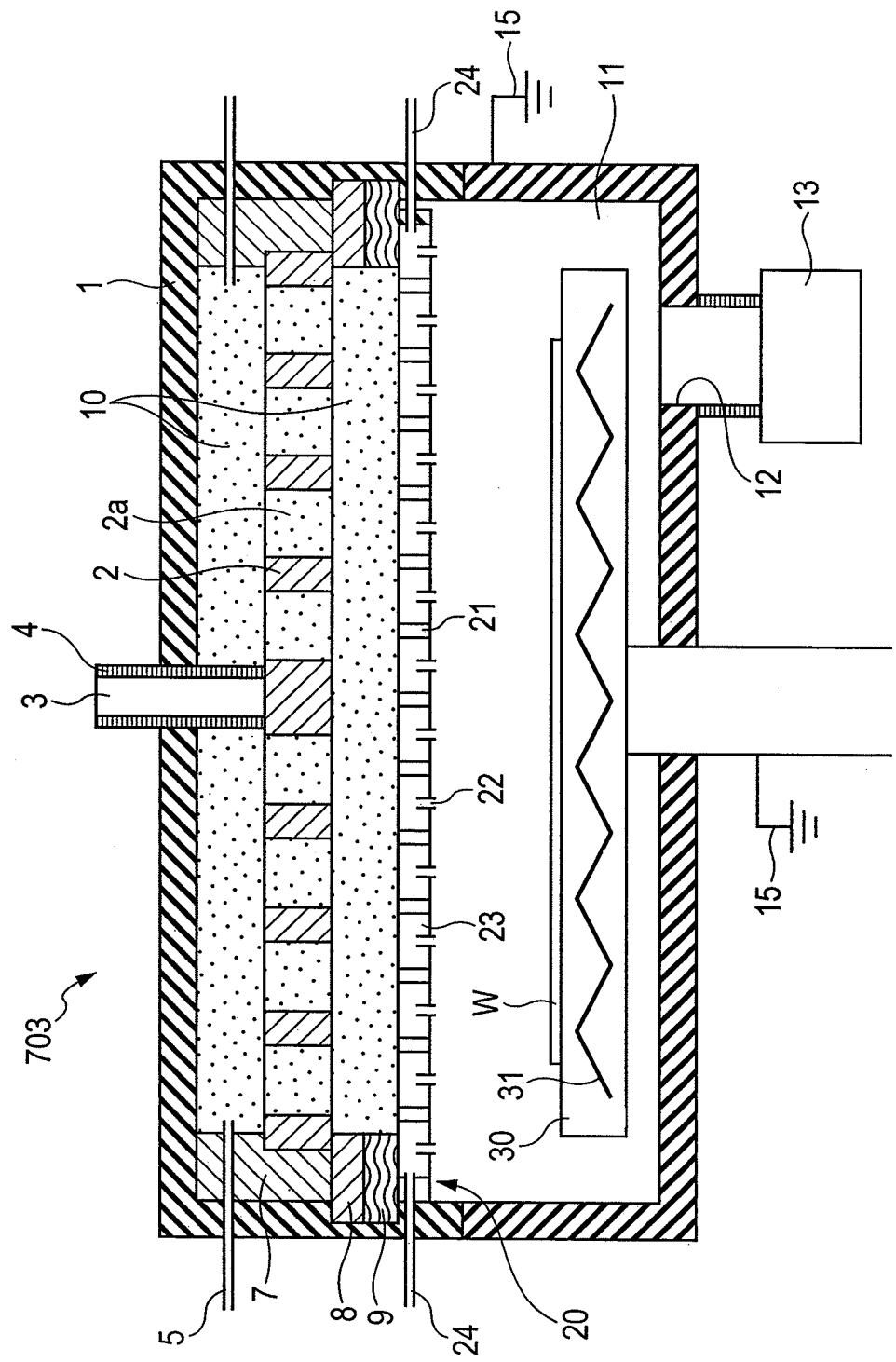
FIG. 5 is a diagram showing an example of a film deposition chamber according to an embodiment of the present invention.

FIG. 5 is a diagram showing an example of a film deposition chamber 703 for performing protective layer deposition processing in the present embodiment.

In FIG. 5, the film deposition chamber 703 comprises a vacuum container 1, an electrode 2, a hole 2a formed through the electrode 2, a power introduction rod 3, an insulator 4 covering the outer periphery of the power introduction rod 3, and a first gas introduction part 5 for introducing a first gas into a plasma generation space 10. The film deposition chamber 703 further comprises insulators 7 and 8, a electric conductor 9 made of metal or the like for grounding a partition wall 20, and the plasma generation space 10, the plasma generating space 10 extending over the electrode 2, within the hole 2a, and under the electrode 2 and being capable of generating plasma. The plasma generation space 10 is partitioned by the inner wall of the vacuum container 1 and the partition wall 20. And the electrode 2 connected with the power introduction rod 3 is provided within the plasma generation space 10. The power introduction rod 3 is connected to a high frequency power source which is not shown in the drawing and plasma is generated in the plasma generation space 10 by the input of discharge power.

Figure 6:
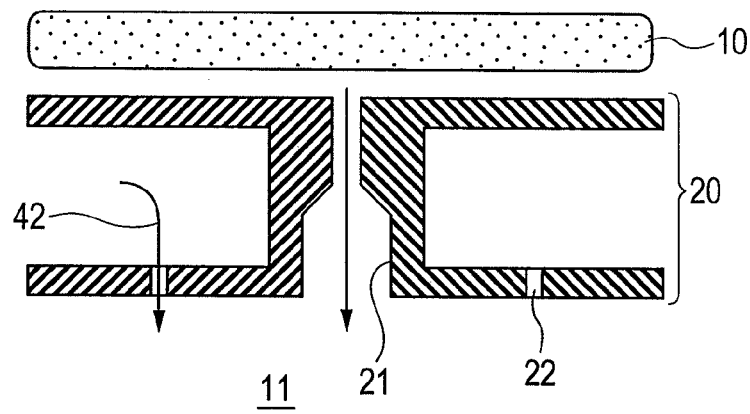
FIG. 6 is a detailed cross-sectional view of a partition wall according to an embodiment of the present invention.

Further, reference numeral 20 indicates the partition wall. Reference numeral 21 indicates a through hole; 22, a diffusion hole; 23, an inner space; and 24, a second gas introduction part for introducing a second gas into the inner space 23. Here, the through hole 21 connects the plasma generation space 10 and a film-deposition processing space 11 located under the partition wall 20 (on the side opposite to the plasma generation space 10 of the partition wall 20) in FIG. 5, to each other. Further, a detailed cross section of the partition wall is shown in FIG. 6, and the diffusion hole 22 connects the inner space 23 and the film-deposition processing space 11 to each other. And the second gas 42 introduced from the second gas introduction part 24 into the inner space 23 is diffused into the film-deposition processing space 11 via the diffusion hole 22.

Reference numeral 30 indicates a substrate holder as a substrate holding part capable of mounting an object to be processed (substrate to be processed) W, and reference numeral 31 indicates a heater buried therein. Then, the object to be processed W is mounted at the upper part of the substrate holder 30. Reference numeral 11 indicates the film-deposition processing space; 12, an exhaustion port; and 13, a turbo-molecular pump as an exhaustion means. The heater 31 is configured to be feed-back controllable according to an output of a temperature detection means which is not shown in the drawing and can adjust the temperature of the substrate holder to a desired value. In the present embodiment, the film-deposition processing space 11 is one region provided with the substrate holder 30, of the two regions of the vacuum container 1 divided by the partition wall 20.

In the apparatus having such a configuration, when plasma is generated under a gas introduction condition, a charged particle such as an ion in the plasma of the first gas will be recombined with the inner wall of the through hole 21 and the like, but an active species in the plasma of the first gas is introduced into the film-deposition processing space 11 without being recombined and reacts with the second gas. Note that, in the present embodiment, it is important that the partition wall 20 functions as a filter that does not, preferably, transmit the charged particle (e.g., ion) but selectively transmits the active species in the plasma of the first gas. Accordingly, the through hole 21 formed through the partition wall 20 may have any size or shape, if configured so as to transmit the active species. Further, if the shape of the through hole 21 satisfies the condition of $u \cdot L/D > 1$, it is preferable to suppress the reverse diffusion of the second gas into the plasma generation space 10. Here, u represents a gas flow rate in the through hole 21, L represents the length of the through hole 21, and D represents a mutual gas diffusion coefficient, that is, a mutual gas diffusion coefficient of the first and second gases.

In the present embodiment, a gas including at least one of gasses such as $O_2$, $O_3$, $N_2$, $NH_3$, $H_2$, NO, and $NO_2$ which contain an O or N atomic element necessary for forming $SiN_x$, $SiO_x$, SiON, or mixture thereof, is introduced into the plasma generation space 10 as a first source gas. Further, as the second source gas, a gas including at least one of silicon compound gasses such as silane, disilane, and TEOS (Tetraethoxy-silane) is introduced into the film-deposition processing space 11.

Thereby, the second source gas introduced into the film-deposition processing space 11 via the diffusion hole 22 and the active species of the first source gas react chemically with each other, and the insulating protective layer 814 (thin film of any one of $SiN_x$ (silicon nitride film), $SiO_x$ (silicon oxide film), and SiON (silicon oxynitride film), laminated film of these films, or mixture of these films) is formed. Note that $SiN_x$ film of the protective layer 814 is preferable because it can be deposited without oxidation of the multilayered structure 811.

Note that, in the present embodiment, the material of the protective layer 814 itself does not have any specific feature but the generation method thereof has a specific feature. Accordingly, the protective layer 814 is not limited to a $SiN_x$, $SiO_x$, or SiON thin film, and may be any thin film if it is an insulating film capable of being formed by CVD. In this case, obviously the first gas and the second gas may be selected optionally depending on the protective layer desired to be formed.

In this manner, in the present embodiment, it is possible to obtain a sufficiently large step coverage since the protective layer 814 is deposited by the CVD using the active species. Further, the following advantages can be obtained.

(a) Since the substrate which is the object to be processed is not irradiated or is irradiated in a reduced amount with high density plasma, it is possible to eliminate or reduce electric charge damage to the substrate.

(b) It is possible to make the film deposition rate 2 to 3 nm/min and it is possible to realize a film deposition rate at which a highly accurate and sufficiently high manufacturing speed can be secured even for a thin film as thin as 2 to 10 nm.

(c) A complicated compound does not need to be used in the formation of the protective layer.

(d) Since input heat from the plasma to the substrate (object to be processed) is suppressed, it is possible to perform the film deposition in a low temperature range of lower than 150° C., preferably not higher than 130° C., and further preferably not higher than 110° C. Accordingly, it is possible to prevent or reduce the magnetic characteristic degradation due to temperature.

(e) Since the film deposition can be performed at a low temperature (e.g., a temperature of lower than 150° C. at which the resist layer 809 is not deformed by heat), it is possible to prevent the deformation of the resist layer 809 and realize the uniform film deposition of the protective layer even when the protective layer is formed on the resist layer 809.

(f) By the advantage (e), a process using only the resist layer 809 for the mask, a process of depositing the protective layer without removing the resist layer 809, a process of removing the protective layer 814 on the cap layer 808 by the lift-off of the resist layer 809, and the like can be employed, and it is possible to reduce the number of process steps and to suppress contamination caused by the increase of the process steps in the manufacturing of the magneto-resistant effect element having a multilayered structure.

The above advantages (d) to (f) will be further explained.

As described above, in the present embodiment, the partition wall 20 is provided between the plasma generation space 10 and the film-deposition processing space 11 and the partition wall 20 is configured so as to transmit the active species of the first source gas generated in the plasma generation space 10 selectively into the film-deposition processing space 11. By the partition wall 20 provided at a boundary part between the plasma generation space 10 and the film-deposition processing space 11 in this manner, it is possible to block the charged particle (ion) of the first source gas and also to block the movement of heat caused by the plasma generated within the plasma generation space 10 into the film-deposition processing space 11. Accordingly, it is possible to form the protective layer 814 even when the object to be processed W is made to have a low temperature.

It is very advantageous to be able to form the protective layer on the magnetic layer in a low temperature range in this manner. That is, in the process of depositing the protective layer 814 on the multilayered structure 811, since the protective layer can be formed in a low temperature range, it is possible to reduce the magnetic characteristic degradation of the multilayered structure 811 and also it is possible to form the protective layer 814 on the resist layer 809' which has been used for the patterning of the multilayered structure 811.

In the present embodiment, it is very important that the protective layer 814 can be formed in the state in which the resist layer 809' remains on the multilayered structure 811, that is, on the resist layer 809' formed on the multilayered structure 811. If the partition wall 20 does not exist in the film deposition chamber 703 shown in FIG. 5 (comparative example), the generation of the plasma of the first source gas applies the heat thereof to the object to be processed W and thus the formation of the protective layer is performed in a high temperature range. At this time, when the protective layer 814 is formed while the resist layer 809' remains as shown in FIG. 2D, the resist layer is deformed due to a high temperature. Then, the protective layer formed thereon is also deformed. Accordingly, it is necessary to remove the resist layer 809' at the time of FIG. 2C in the comparative example.

In this manner, when the removal process step of the resist layer 809' is performed between the etching processing of the multilayered structure 811 and the formation of the protective layer 814 as in the comparative example, the number of process steps is increased by the removal process step. And further, a problem arises that the side face of the multilayered structure 811 exposed by the etching in Step S901 is damaged in the removal of the resist layer 809'.

In contrast, in the present embodiment, the movement of the heat caused by the plasma is suppressed from the plasma generation space 10 to the film-deposition processing space 11 by the partition wall 20 provided between the plasma generation space 10 and the film-deposition processing space 11, and thereby it is possible to perform the deposition of the protective layer 814 in a low temperature range as described above. Accordingly, it is possible to suppress the deformation of the resist layer 809' even when the protective layer 814 is deposited in the state in which the resist layer 809' remains on the multilayered structure 811.

In this manner, in the present embodiment, the protective layer 814 can be formed uniformly even when the protective layer 814 is deposited on the object to be processed W in the state in which the resist layer 809' is formed on the multilayered structure 811, in Step S902. Accordingly, it is possible to remove the remaining resist layer 809' together with the unnecessary protective layer by the lift-off in Step S904 at the same time to realize the reduction in the number of the process steps. Further, as shown in FIGS. 2E and 2F, the protective layer 814 is formed on the side face of the multilayered structure 811 exposed by the etching in Step S901 when the remaining resist layer 809' is to be removed, and thereby there is not a problem that the side plane of the multilayered structure 811 after the etching is damaged by the removal processing of the resist layer 809'.

That is, in the present embodiment, the protective layer 814 is formed on the surface including also the resist layer 809' while the resist layer 809' used for the pattern formation of the multilayered structure 811 remains on the multilayered structure 811, and thereby it is possible to perform the removal of the unnecessary protective layer 814 and the remaining resist layer 809' at the same time and also to remove the resist layer 809' while suppressing the damage to the exposed side face of the multilayered structure 811.

The present embodiment employs a structure as follows for realizing the method, which is specific to the present invention having such advantages, that the protective layer 814 is formed in the state in which the resist layer 809' remains on the multilayered structure 811, while also forming the preferable protective layer 814. That is, the plasma generation space 10 for generating the plasma of the first source gas and the film-deposition processing space 11 for performing the actual film deposition are provided separately from each other, the movement of the charged particles generated by the plasma and the movement of the heat caused by the plasma are reduced from the plasma generation space 10 to the film-deposition processing space 11, and also the structure selectively transmitting the active species of the first source gas is provided at the boundary part between the two spaces. The structure selectively transmitting the active species in this manner includes the through hole 21 configured so as to connect the plasma generation space 10 and the film-deposition processing spaces 11 to each other, for example.

Note that, while the present embodiment divides the inside of the single vacuum container 1 into two spaces by the partition wall 20 and uses one for plasma generation space 10 and the other for the film-deposition processing space 11, it is important in the present embodiment that the plasma generation space 10 and the film-deposition processing space 11 are provided respectively and a structure functioning as the partition wall 20 is provided in the region connecting these two spaces. That is, it is important that the first space and the second space are configured such that the actual film deposition is performed in the second space (film-deposition processing space 11) provided separately from the first space (plasma generation space 10) for generating the plasma in order to generate the active species necessary for the CVD film deposition of the protective layer 814, the movement of the charged particles and the heat generated by the plasma that moves from the first space to the second space is reduced, and also the first space and the second space are connected to each other so as to permit the movement of the active species from the first space to the second space. Accordingly, if such a configuration is realized, the configuration is not limited to the configuration shown in FIG. 5. For example, a plasma generation container (plasma generation space) configured to introduce the first source gas and also generate the plasma and a film deposition processing container (film-deposition processing space) configured to introduce the second source gas and also deposit the protective layer 814 on the object to be processed W may be prepared separately from each other and the partition wall 20 having at least one through hole connecting the two containers (i.e., plasma generation space and film-deposition processing space) to each other may be provided between these two containers.

While the embodiment has been explained as above, the application of the present invention is not limited to the embodiment. For example, the above described film deposition process of the protective layer 814 can be applied for the case of using a hard mask layer such as Ta instead of the resist layer 809. In this case, since the magnetic characteristic of the magneto-resistance effect element is degraded considerably at a temperature equal to or higher than 200° C. (thermal diffusion starts at an interface of the stacked magnetic films), it is preferable to perform the processing at a temperature lower than 200° C. Note that, also when the hard mask layer is used, it is necessary to form a resist layer for patterning the hard mask. For this reason, the process flow of etching the multilayered structure 811 only with the resist layer 809 has an advantage of reducing the process steps.

Further, reactive ion etching (RIE) may be used instead of the IBE, and alcohol gas, mixture of carbon hydride and inert gas, or the like can be used as an example of etching gas. Similarly, not limited to the TMR element for a magnetic head, the above described CVD film deposition may be applied for the formation of an insulating protective film also in the manufacturing process of a TMR element for an MRAM and the manufacturing process of a GMR element in which a conductive non-magnetic layer (Cu layer or the like) is formed instead of the barrier layer 806.

Further, the partition wall 20 is not limited to one having the inner space in the apparatus of FIG. 5, and may be a thin mesh type wall having only through holes formed therein.

Note that, while the etching process step and the film deposition process step of the protective layer 814 are continuously realized in vacuum using the transfer chamber in the present embodiment, these respective process steps may be performed in different apparatuses, respectively. Note that, since the processed surface of the magnetic film subjected to the etching (work processing) is easily oxidized, water in the air adheres to the processed surface and accelerates the oxidation when the magnetic film is exposed to the air after the processing. When the insulating protective film is deposited after that, the magnetic film is further oxidized by an oxide layer or water trapped over the magnetic film surface and the magnetic characteristic of the magneto-resistance effect element changes over time. Accordingly, by the continuous process in vacuum, the substrate can be processed keeping cleanness and thereby the magneto-resistance effect element can be manufactured without inviting degradation, variation, and the like in the characteristic thereof.

EXAMPLE 1

For confirming that the present invention satisfies a requirement for electron density, an electron density measurement test of the film-deposition processing space 11 was carried out as an example using an apparatus shown in FIG. 5. Saturated ion current density was measured at a point 11 mm directly above a substrate to be processed using a Langmuir probe, for an embodiment of the present invention in order to measure the electron density of the film-deposition processing space 11.

$NH_3$ of 500 sccm or $O_2$ of 500 sccm and argon of 50 sccm were used for process gas and carrier gas, respectively, to be introduced into the plasma generation space 10. A power of 700 W was input to the high frequency power electrode disposed in the plasma generation space 10. The test was carried out at a process pressure of 20 Pa.

Figure 7:
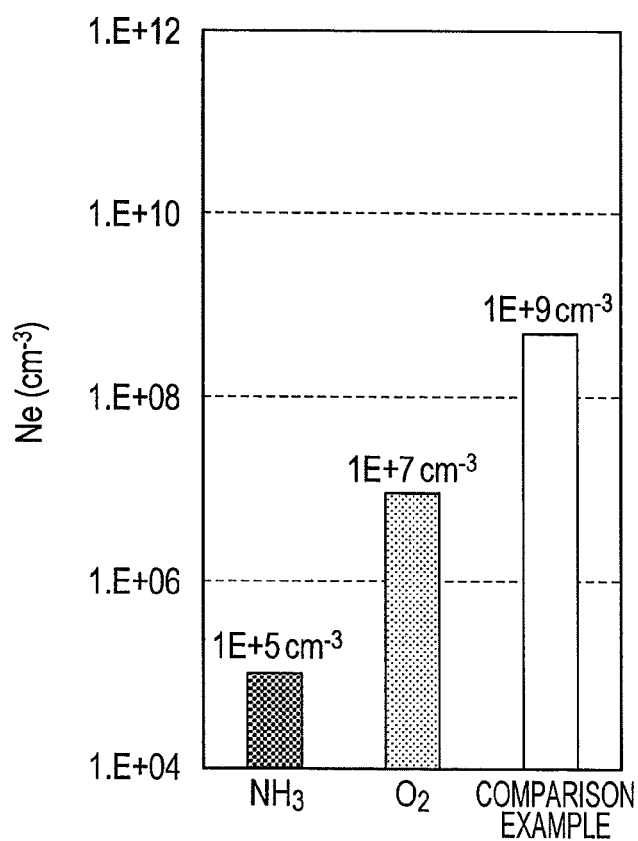
FIG. 7 is a diagram showing a measurement result of an electron density according to an embodiment of the present invention.
Figure 9:
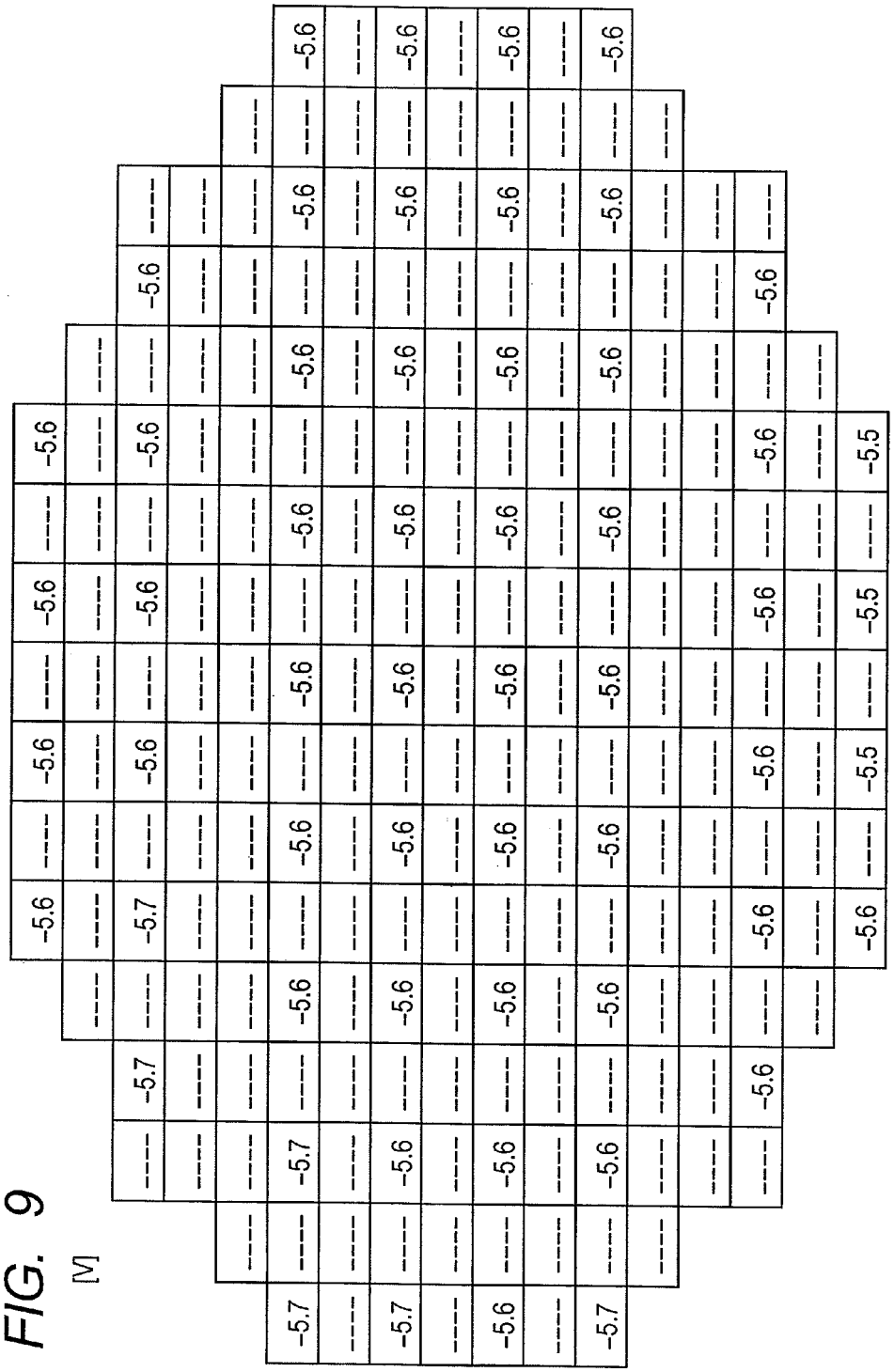
FIG. 9 is a diagram showing a measurement result of a MOS capacitor I V characteristic according to an embodiment of the present invention. (Insulation breakdown voltage of Example)

As a result, as shown in FIG. 7, the electron density flowing into the film-deposition processing space was kept equal to or lower than $1 \times 10^{+7}$ $cm^{-3}$, and the electron density was shown to be lower in more than two to four order than that of a conventional process using capacitance coupling plasma without having the partition wall 20 (Comparative example).

EXAMPLE 2

Next, a test confirming a damage reduction effect was carried out as Example 2.

In Example 2, a MOS capacitor was processed using the same apparatus under the same process condition.

As a comparative example, the same test was carried out for a capacitance coupling type apparatus without having the partition wall 20. The test was carried out under the condition; oxygen: 500 sccm, pressure: 180 Pa, and input power: 1,000 W.

The measurement was carried out at 56 points on the surface of an wafer and at an antenna ratio (area ratio of an upper electrode to a gate oxide film) of 700,000.

FIGS. 8 to 11 are diagrams showing a result of damage evaluation by the measurement of an I V characteristic of the MOS capacitor. Each of the numerical values in FIG. 8 (Example 2) and FIG. 10 (Comparative example) shows a leak current (pA) of each point, and, when the damage exists, the absolute value of the leak current in the MOS capacitor becomes larger. Further, each of the numerical values in FIG. 9 (Example 2) and FIG. 11 (Comparative example) shows an absolute insulation breakdown voltage (V), and when the damage exists, the absolute value of the insulation breakdown voltage becomes smaller.

Figure 10:
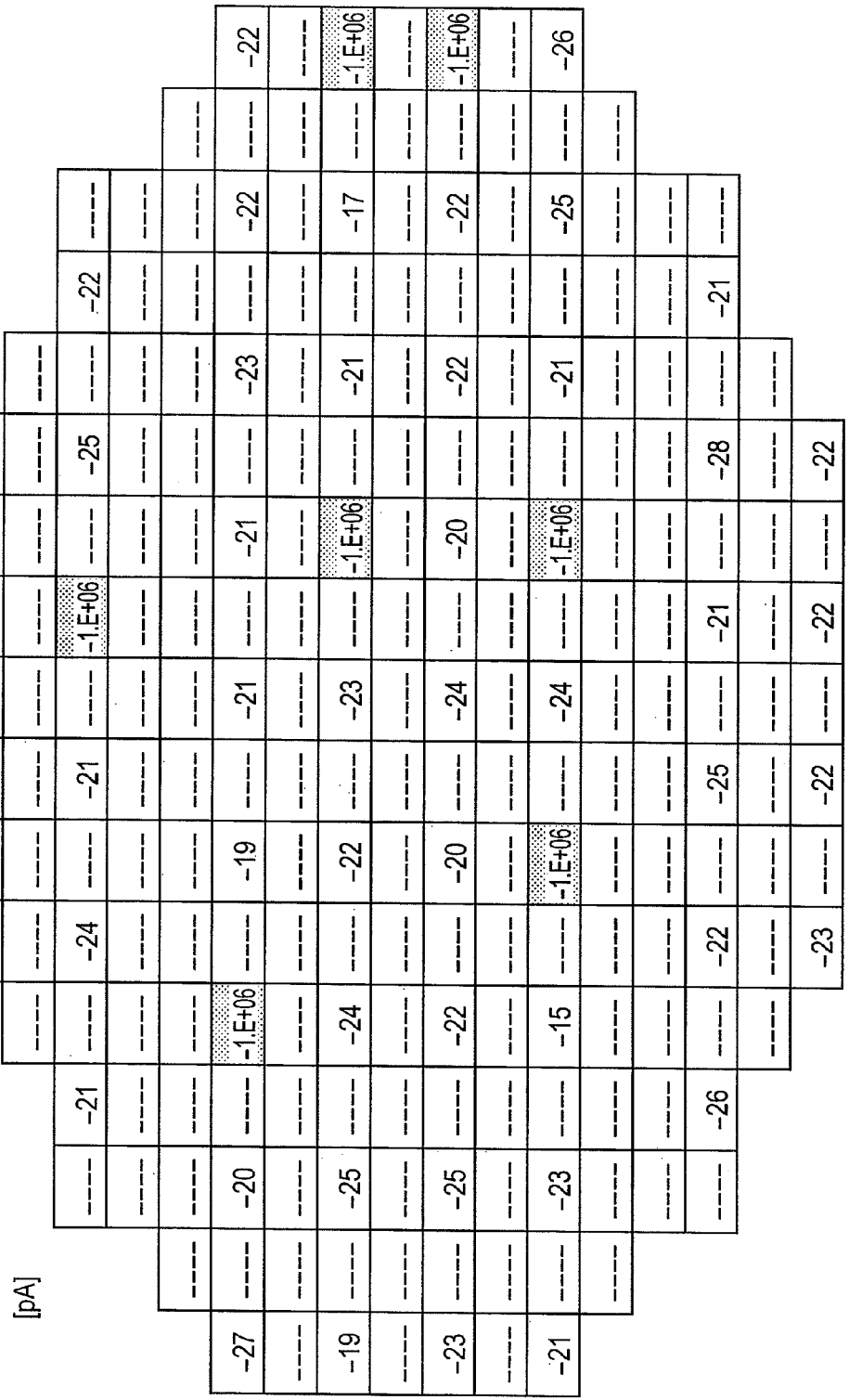
FIG. 10 is a diagram showing a measurement result of a MOS capacitor I V characteristic according to an embodiment of the present invention. (Leak current of Comparative example)
Figure 11:
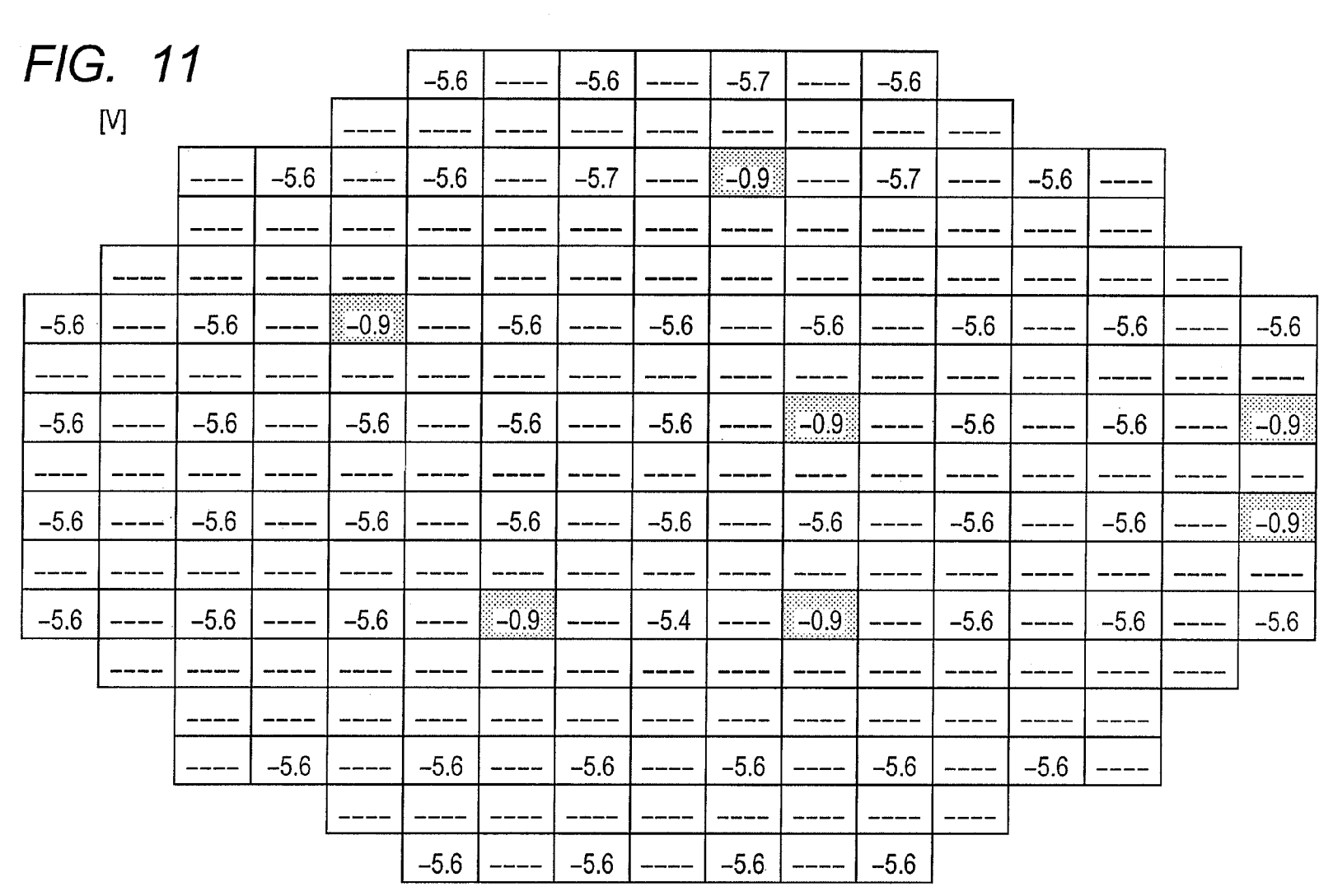

In Comparative example, the absolute value of the leak current was as high as 1E+6 pA locally in some region within the wafer surface and a small insulation breakdown voltage was also measured locally in some region (refer to FIG. 10 and FIG. 11). From this result, it was confirmed that the electron density in the plasma was high and thereby a bias of an electrical potential was induced within the substrate surface due to a small non-uniformity of the plasma. On the other hand, in Example 2, it was confirmed that the leak current was 40 pA or smaller uniformly within the wafer surface, the insulation breakdown voltage was also uniform within the surface, and the damage did not exist (refer to FIG. 8 and FIG. 9).

EXAMPLE 3

In Example 3, a SiN film was deposited using the apparatus shown in FIG. 5 and various kinds of advantage were confirmed.

The film deposition condition was as follows. A high frequency power of 700 W was input, and $NH_3$ was introduced at 50 sccm into the plasma generation space 10 and mixture gas of $SiH_4$ and Ar was introduced at 65 sccm in total into the film-deposition processing space 11. Further, the film deposition was carried out after the substrate temperature had been adjusted to each temperature condition by the heater 31.

Figure 12:
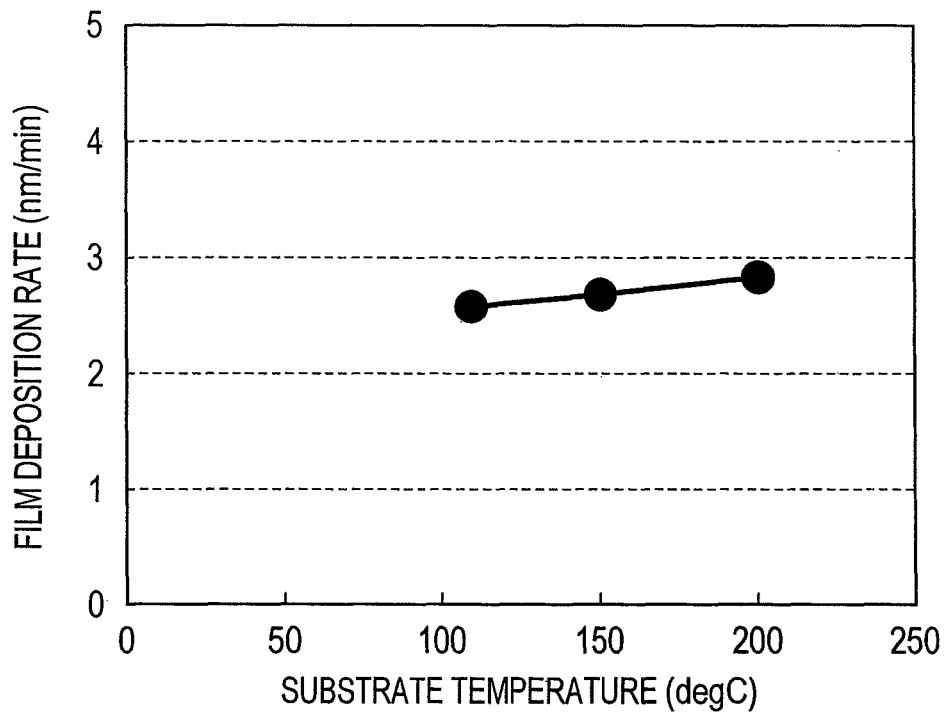
FIG. 12 is a graph showing a temperature dependence of film deposition speed according to an embodiment of the present invention.

FIG. 12 shows the temperature dependence of a film deposition rate.

While, in the ALD which is a conventional method, a film of 0.1 to 0.15 nm is formed in one cycle and only a thickness in a range of 0.6 to 0.9 nm can be deposited in a minute when the time of the one cycle is assumed to be 10 seconds, it is possible to obtain a sufficiently high deposition rate for the formation of a 5 nm or thicker protective film in the present invention since the film deposition rate is 2.75 nm/min at a film deposition temperature of 110° C.

Figure 13:
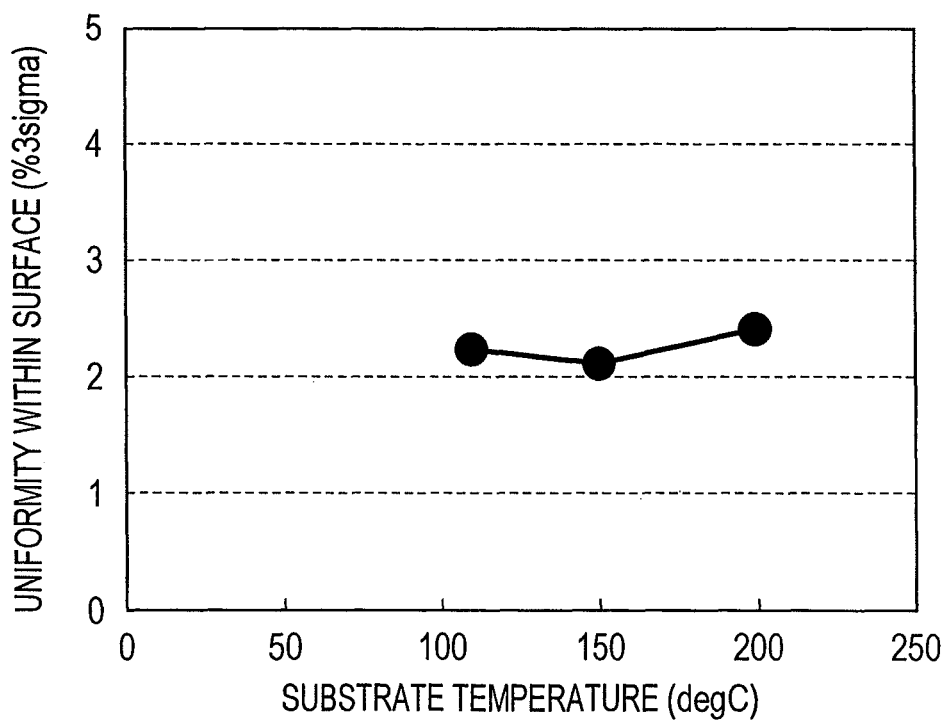
FIG. 13 is a graph showing a temperature dependence of in-surface distribution according to an embodiment of the present invention.

FIG. 13 shows the temperature dependence of a distribution within the surface.

The distribution within the surface was confirmed on a 200 mm substrate. A film was deposited over the whole surface of the substrate surface and the measurement was carried out at 49 points 3 mm inside the edge thereof. For the film deposition distribution, a uniformity of 3% or smaller variation in 3σ was obtained at a temperature of the substrate to be processed as low as 110° C.

Figure 14:
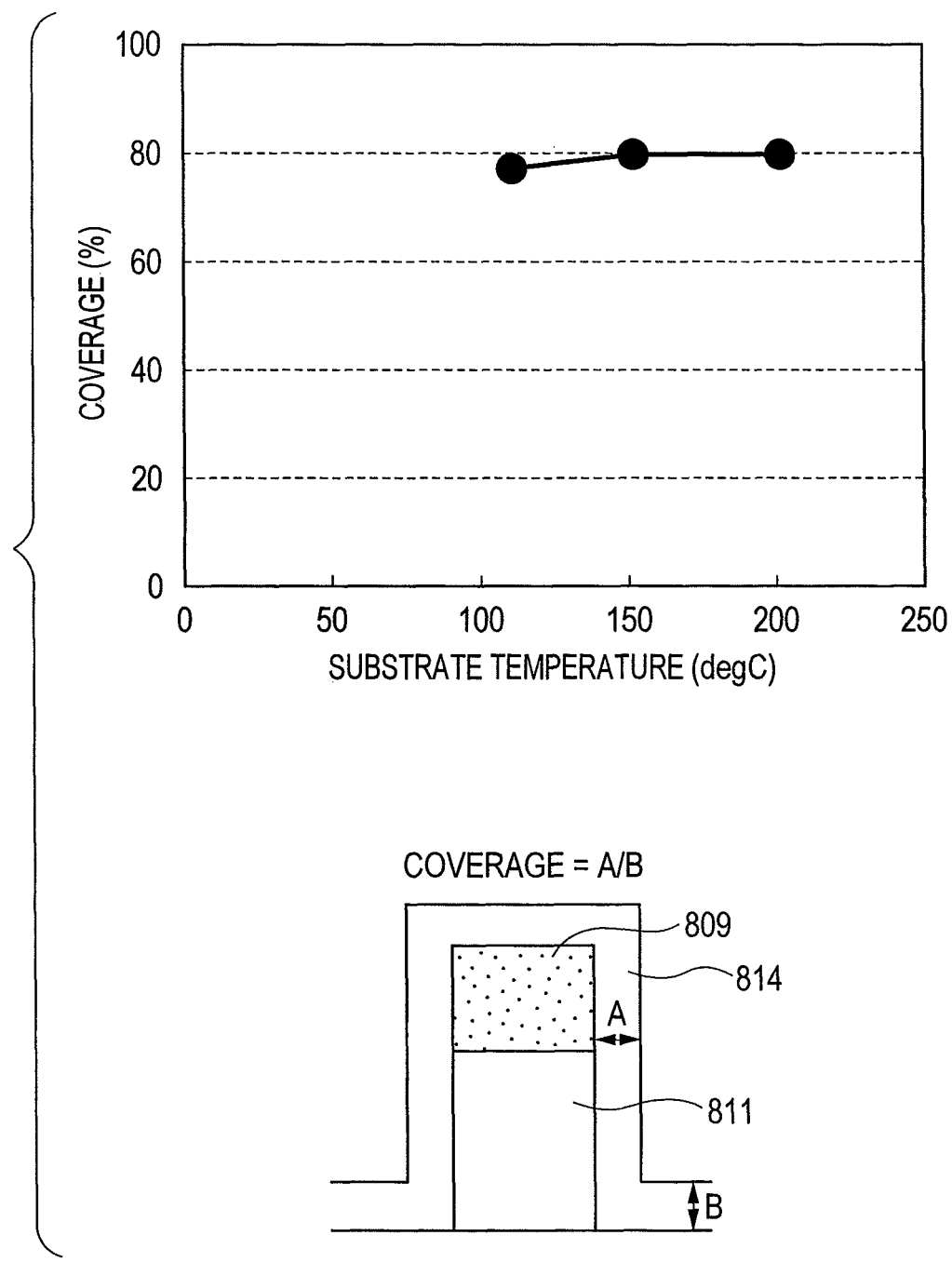
FIG. 14 is a graph showing a temperature dependence of coverage according to an embodiment of the present invention.

FIG. 14 shows the temperature dependence of the coverage.

Approximately 80% coverage was obtained even at a temperature of the substrate to be processed as low as 110° C.

Figure 15:
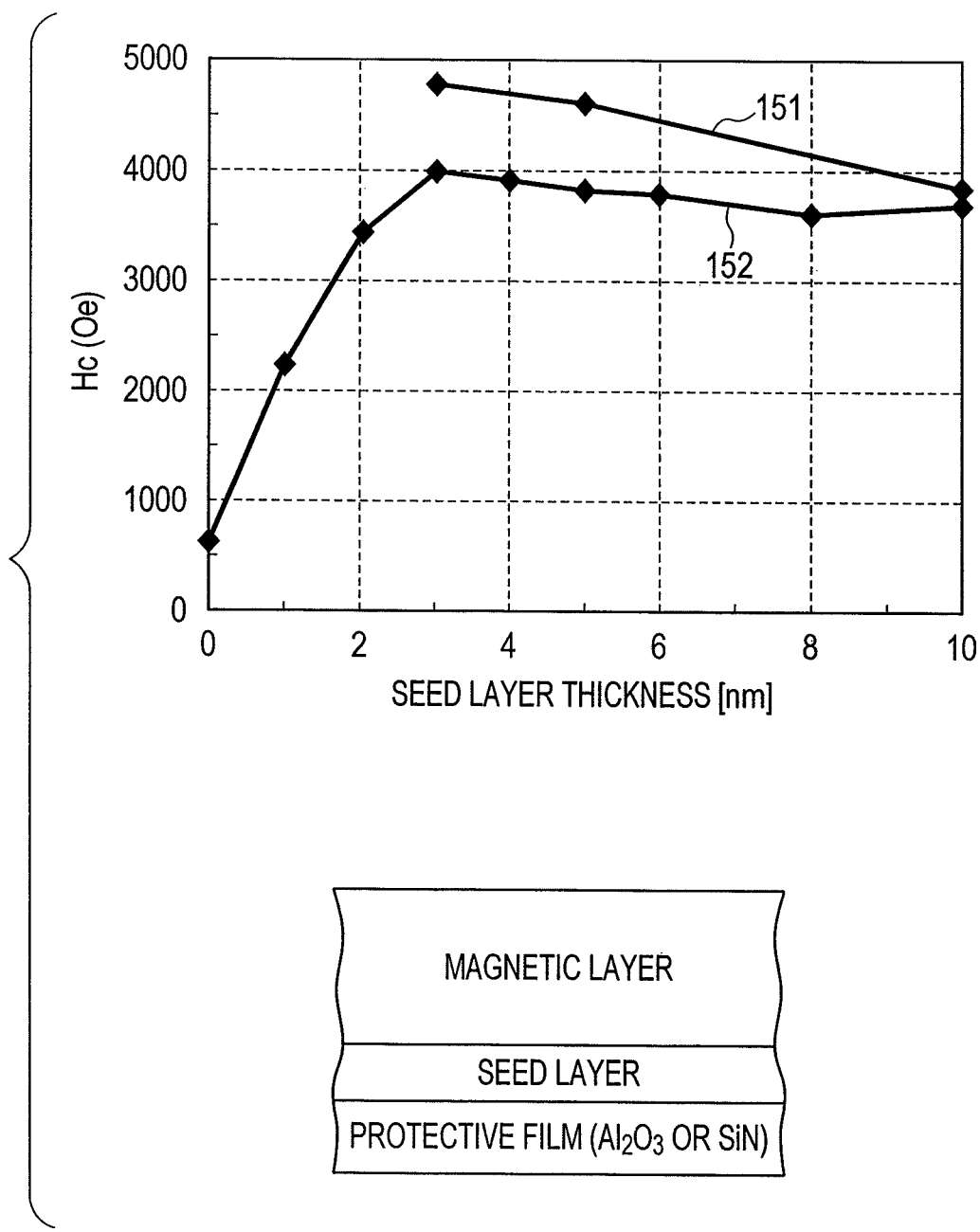
FIG. 15 is a graph showing a coercive force for a case in which a magnetic layer is deposited using a protective film as an underlayer according to an embodiment of the present invention.

FIG. 15 shows a coercive force when the magnetic layer was deposited using the protective film as an underlayer.

The coercive force was confirmed when a seed layer and the magnetic layer were formed on the protective film and the thickness of the seed layer was varied. In FIG. 15, reference numeral 151 indicates a graph showing a relationship between the coercive force of the magnetic layer and the thickness of the seed layer which were formed on an SiN film deposited by a method according to an embodiment of the present invention. Reference numeral 152 indicates a graph showing a relationship between the coercive force of the magnetic layer and the thickness of the seed layer which were formed on an $Al_2O_3$ film deposited by a conventional method. A high coercive force was obtained in the magnetic layer formed on the SiN film deposited by the present invention compared to the $Al_2O_3$ film deposited by the conventional method.

The insulation breakdown characteristic was 5 $MV/cm^2$ in the $Al_2O_3$ film deposited by the conventional method and the SiN film deposited by the present invention showed a sufficiently good insulation breakdown characteristic of 9 to 10 $MV/cm^2$, in a wide thickness range of 50 A to 1,000 A.

For comparing low temperature film deposition and high temperature film deposition, shape comparison was carried out using an organic resist mask at 150° C. and 110° C., and a pattern shape was distorted because of the deformation of the organic mask at 150° C., but the deformation was not observed particularly at 110° C.

What is claimed is:

1. A manufacturing method of a magneto-resistance effect element comprising a multilayered structure including two ferromagnetic layers and an intermediate layer sandwiched between the ferromagnetic layers,
    wherein a partition wall having at least one through-hole is provided between a plasma generation space capable of generating plasma and a film-deposition processing space which is provided separately from the plasma generation space and in which a substrate holding part capable of mounting a substrate to be processed is disposed,
    the plasma generation space and the film-deposition processing space are connected to each other by the at least one through-hole, and
    the method comprises:
        introducing an active species generated from a first source gas in the plasma generation space into the film-deposition processing space through the at least one through-hole; and
        causing the reactive species to react with a second source gas in the film-deposition processing space to form an insulating protective layer on a multilayered structure formed in the substrate to be processed mounted on the substrate holding part.

2. The manufacturing method of a magneto-resistance effect element according to claim 1, wherein the protective layer is any one of a silicon nitride film, a silicon oxide film and a silicon oxynitride film, a stacked film thereof, or a mixed film thereof.

3. The manufacturing method of a magneto-resistance effect element according to claim 1, wherein the protective layer is deposited on the multilayered structure which has been processed using an organic mask material, at a deposition temperature of less than 150° C.

4. The manufacturing method of a magneto-resistance effect element according to claim 3, wherein the protective layer is deposited while the organic mask material used in the processing is left on the multilayered structure.

5. The manufacturing method of a magneto-resistance effect element according to claim 1, wherein electron density of plasma flowing into the film-deposition processing space from plasma generated in the plasma generation space is equal to or lower than $1 \times 10^{+7}$ $cm^{-3}$, in the deposition of the protective layer.

6. The manufacturing method of a magneto-resistance effect element according to claim 1, wherein the processing of the multilayered structure using a mask material and the deposition of the protective layer onto the multilayered structure which has been processed using the mask material are performed continuously under vacuum.

* * * * *